(12) United States Patent
Weis

(10) Patent No.: US 7,208,373 B2
(45) Date of Patent: Apr. 24, 2007

(54) METHOD OF FORMING A MEMORY CELL ARRAY AND A MEMORY CELL ARRAY

(75) Inventor: Rolf Weis, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/140,143

(22) Filed: May 27, 2005

(65) Prior Publication Data
US 2006/0270159 A1    Nov. 30, 2006

(51) Int. Cl.
*H01L 21/8142* (2006.01)
(52) U.S. Cl. .................. 438/257; 438/211; 438/294; 438/296; 438/201; 438/222; 257/E21.646; 257/E21.653
(58) Field of Classification Search ................ 257/296, 257/300, 301, 302, 303, E27.084, E27.09, 257/E27.092, E27.095, E21.646, E21.66, 257/E21.651, E21.65, E21.075, E21.653; 438/257, 243, 244, 218, 221, 222, 294, 296, 438/270, FOR. 189, FOR. 212, 201, 211, 438/237–239, 259, FOR. 221, FOR. 227, 438/FOR. 430, FOR. 208
See application file for complete search history.

(56) References Cited

U.S. PATENT DOCUMENTS

2006/0056228 A1*   3/2006   Schloesser et al. ......... 365/149

OTHER PUBLICATIONS

C.H. Lee et al., "Novel Body Tied FinFET Cell Array Transistor DRAM with Negative Word Line Operation for sub 60nm Technology and beyond", IEEE 2004, pp. 130-131.

* cited by examiner

*Primary Examiner*—Michelle Estrada
*Assistant Examiner*—Quovaunda Jefferson
(74) *Attorney, Agent, or Firm*—Steven E. Dicke; Dicke, Billig & Czaja, PLLC

(57) ABSTRACT

A method of forming a memory cell array comprising a plurality of memory cells, each of the memory cells including a trench capacitor and a transistor is disclosed. In one embodiment, during the formation of the transistors, after the definition of isolation trenches and corresponding active areas, providing a gate electrode comprises etching the insulating material in the isolation trenches at a portion adjacent to the channel so that a portion of the channel is uncovered, the portion having the shape of ridge comprising a top side and two lateral sides, providing a gate insulating layer on the top side and the two lateral sides, providing a conducting material on the gate insulating layer so that as a result the gate electrode is disposed along the top side and the two lateral sides of the channel, wherein etching the insulating material in the isolation trenches is performed in which the insulating material is locally etched, wherein the insulating material in the upper portion of insulation grooves which separate active areas from each other is maintained.

15 Claims, 16 Drawing Sheets

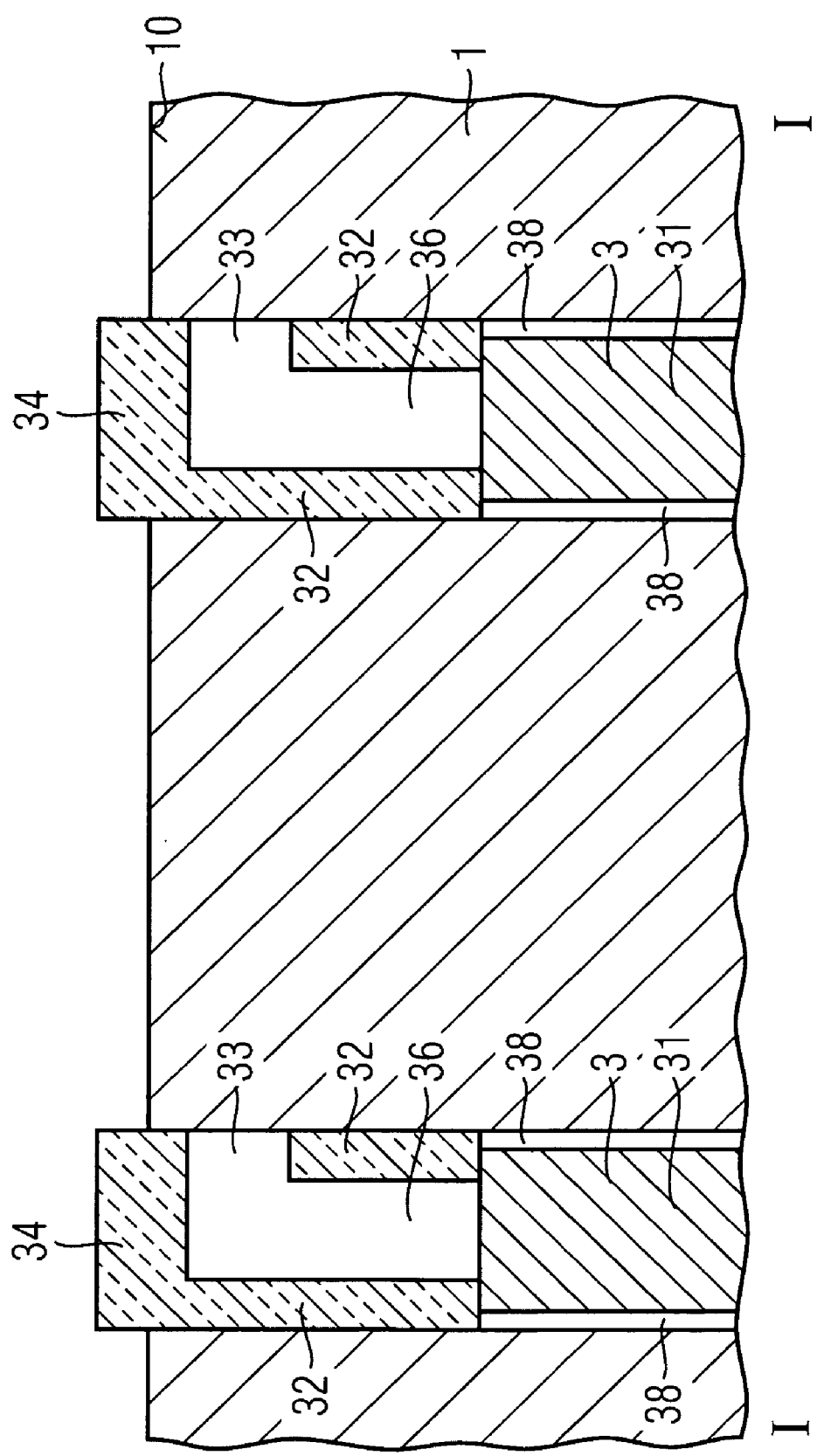

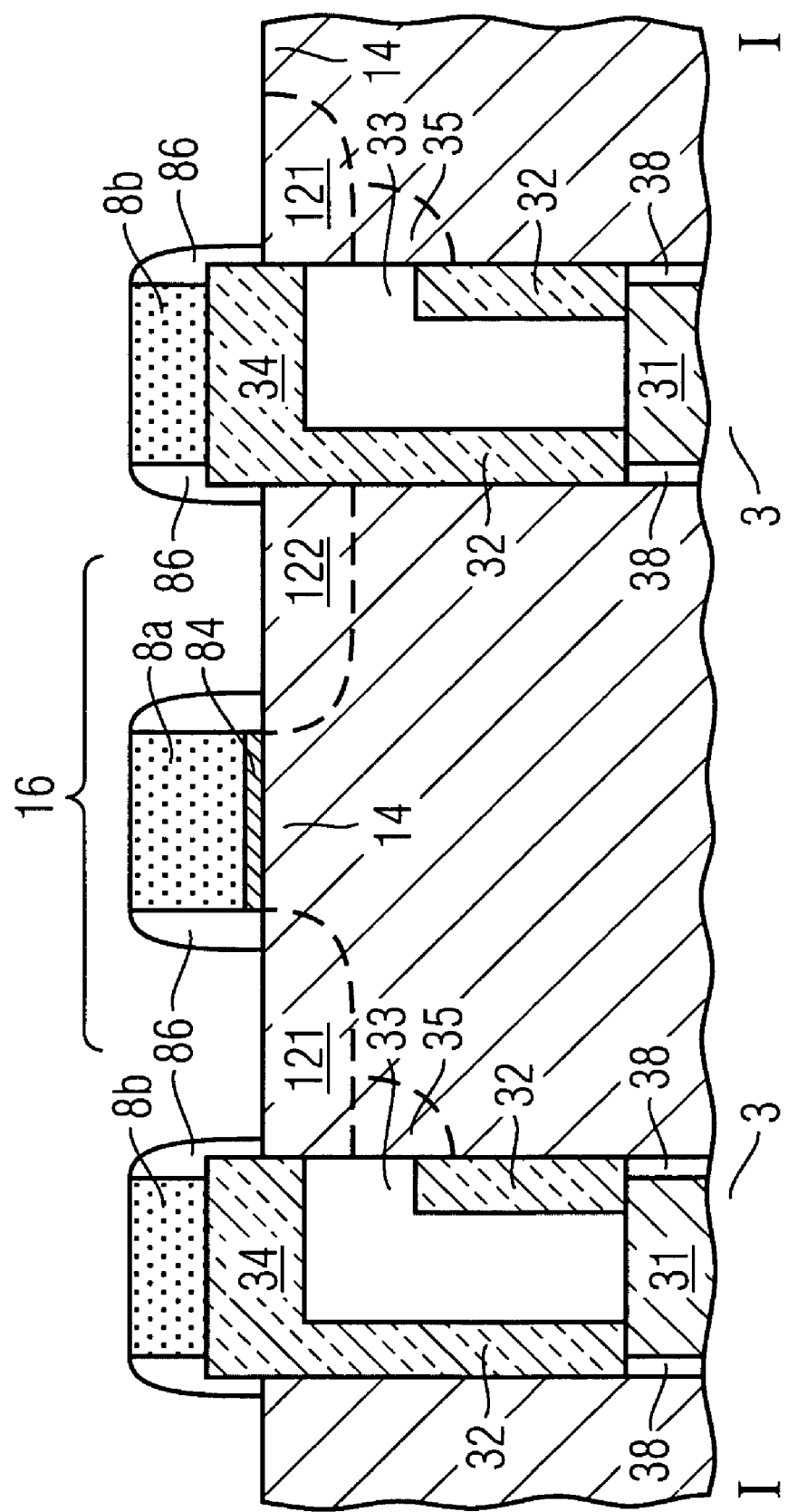

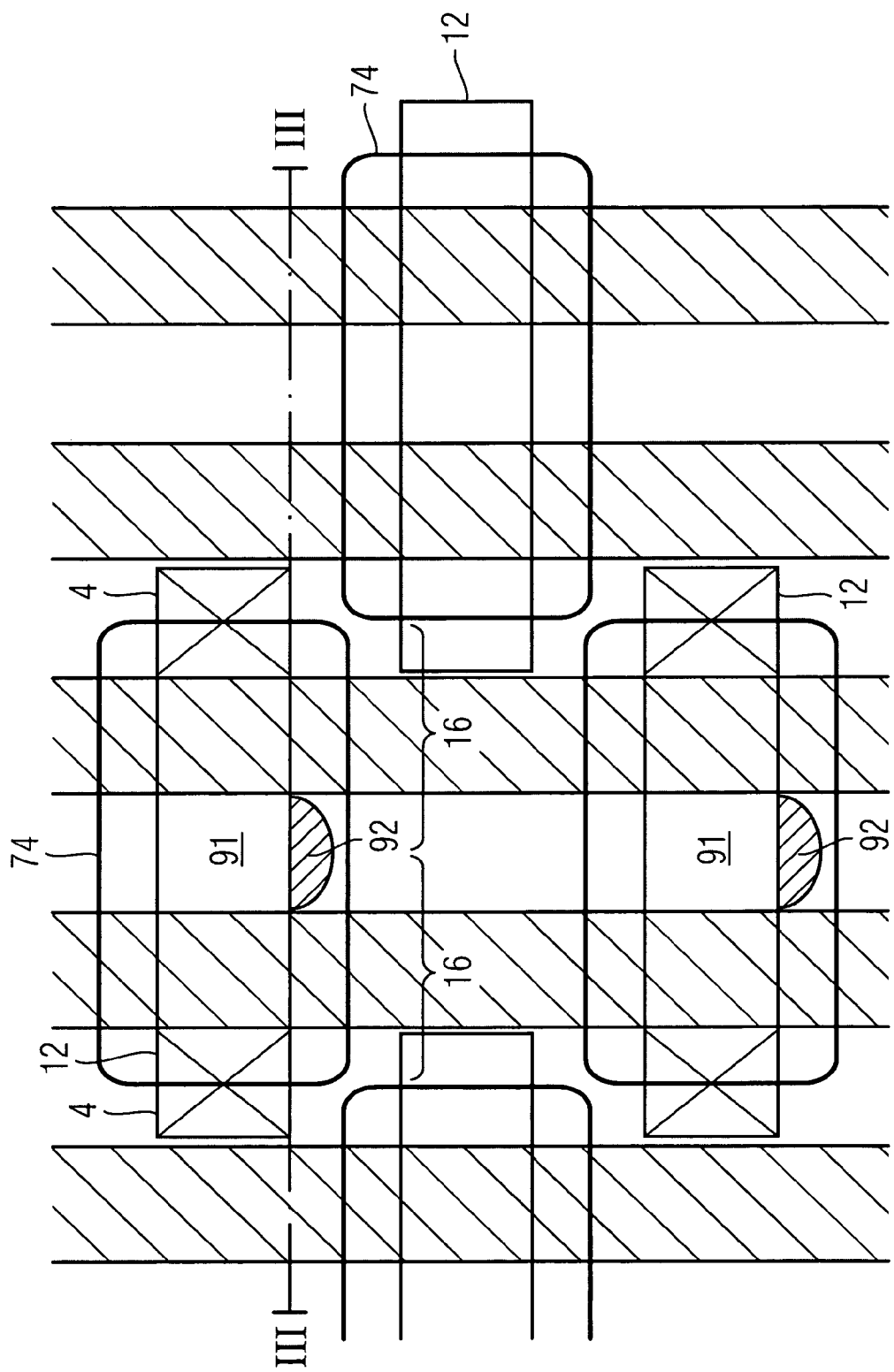

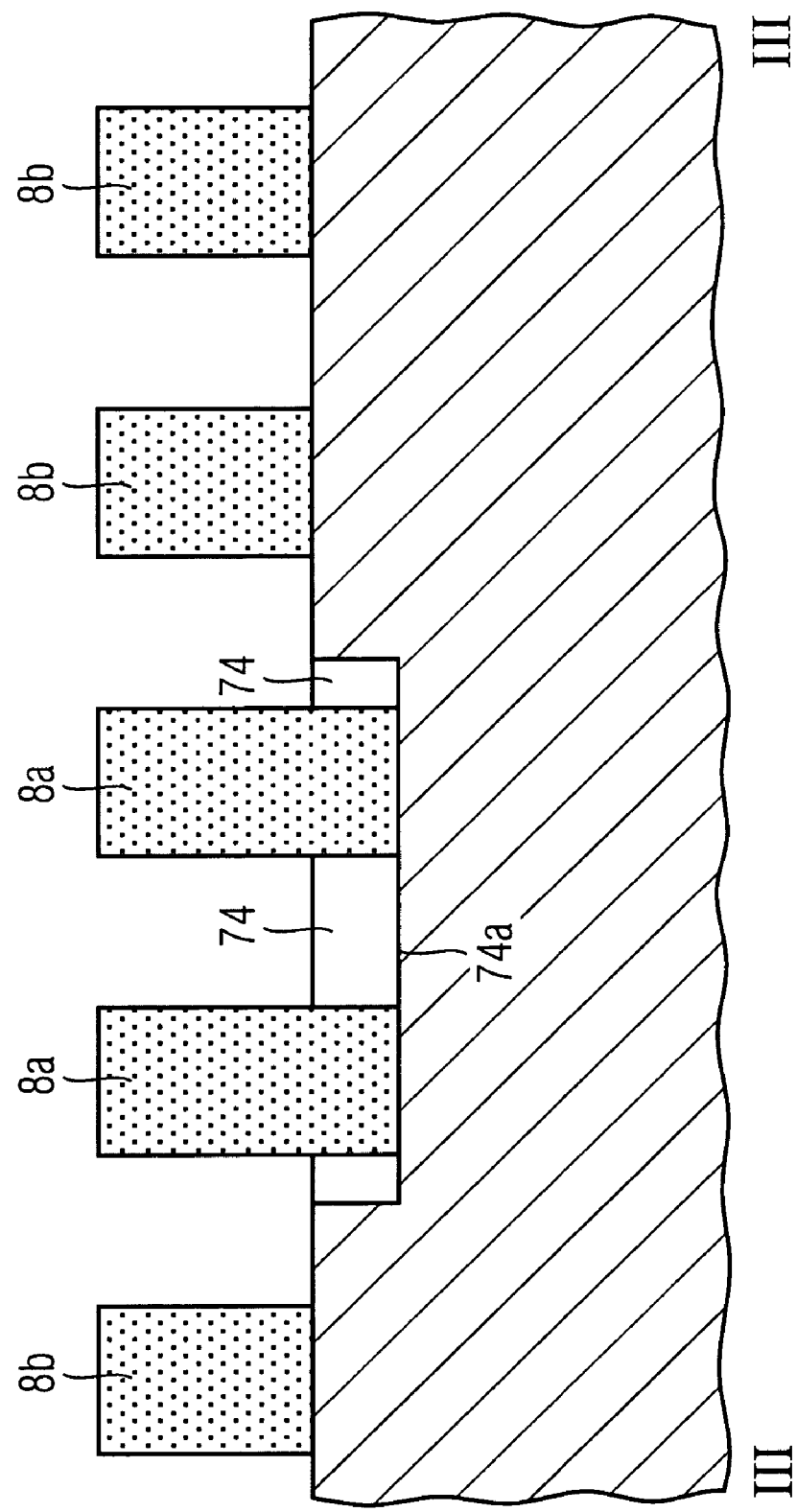

METHOD OF FORMING A MEMORY CELL ARRAY AND A MEMORY CELL ARRAY

FIELD OF THE INVENTION

The present invention relates to a method of forming a memory cell array as well as to a memory cell array.

BACKGROUND

Memory cells of a dynamic random access memory (DRAM) include a storage capacitor for storing an electrical charge which represents an information to be stored, and an access transistor for addressing the storage capacitor. The access transistor includes a first and a second source/drain regions, a conductive channel adjacent to the first and second source/drain regions as well as a gate electrode controlling an electrical current flowing between the first and second source/drain regions. The transistor usually is formed in a semiconductor substrate. The information stored in the storage capacitor is read out by addressing the access transistor. There is a lower boundary of a channel length of the access transistor, below which the insulation properties of the access transistor in an non-addressed state are non-sufficient. The lower boundary of the effective channel length $L_{eff}$ limits the scalability of planar transistor cells having an access transistor which is horizontally formed with respect to the substrate surface of the semiconductor substrate.

A specific transistor concept refers to a FinFET. The active area of a FinFET usually has the shape of a fin or a ridge which is formed in the semiconductor substrate between the first and second source/drain regions. A gate electrode encloses the fin at two or three sides thereof. In particular, in a double-gate FinFET, two gate electrodes are disposed at the two lateral sides of the active area. In addition, a top gate can be provided, which is formed on the top side of the active area. The portions of the gate electrode which portions laterally extend along the active area can extend to a predetermined depth. In particular, the lateral portions of the gate electrode can be provided so as to extend to a depth which is above half of the depth of the isolation trench which is disposed adjacent to the active area.

In currently-used DRAM memory cells, the storage capacitor can be implemented as a trench capacitor. In such a trench capacitor the two capacitor electrodes are formed in a trench which extends into the substrate in a direction perpendicular to the substrate surface. According to another implementation of a DRAM memory cell, the electrical charge is stored in a stacked capacitor, which is formed above the surface of the substrate.

"Novel Body Tied FinFET Cell Array Transistor DRAM with Negative Word Line Operation for sub 60 nm Technology and beyond", by C. H. Lee at al., 2004 Symposium on VLSI technology, Digest of Technical Papers, pp. 130 discloses a method of forming a memory cell array in which each memory cell comprises a storage capacitor which is implemented as a stacked capacitor. For forming the transistor array, first, segmented active areas are formed by known methods. Thereafter, the whole transistor array is covered by an insulating layer. For removing the insulating layer from the lateral sides of the active areas, an etching step is performed in which the peripheral portion of the memory device is masked by a block mask. In a later step, a hard mask material is deposited and patterned, thereby forming stripes which extend perpendicular to the active areas. Thereafter, the active areas are locally thinned taking the patterned hard mask layer as an etching mask. The patterned hard mask layer is as well taken as a mask for a subsequent implantation step. In a later step, stacked capacitors are formed by usual methods.

For forming a memory cell array comprising trench capacitors, the problem arises, that, when globally removing the insulating layer from the array portion of the memory cell array, also a trench top oxide which fills the upper portion of the capacitor trenches is removed.

In addition, problems with the buried strap, the connection between the trench capacitor and the array device, can arise. To be more specific, by removing the oxide on top of the buried strap, problems with the gate conductor formation can be caused. In particular, if a 8 $F^2$ checkerboard array is implemented, the passing word line is running over the deep trenches. If no trench top oxide is left on the trenches, only the gate oxide insulates the passing word line from the deep trench fill which is not sufficient.

SUMMARY

Embodiments of the invention provide a memory cell array and method of forming a memory cell array. In one embodiment, the method of forming a memory cell array includes a plurality of memory cells, each of the memory cells including a trench capacitor and a transistor is disclosed. In one embodiment, during the formation of the transistors, after the definition of isolation trenches and corresponding active areas, providing a gate electrode comprises etching the insulating material in the isolation trenches at a portion adjacent to the channel so that a portion of the channel is uncovered, the portion having the shape of ridge comprising a top side and two lateral sides, providing a gate insulating layer on the top side and the two lateral sides, providing a conducting material on the gate insulating layer so that as a result the gate electrode is disposed along the top side and the two lateral sides of the channel, wherein etching the insulating material in the isolation trenches is performed in which the insulating material is locally etched, wherein the insulating material in the upper portion of insulation grooves which separate active areas from each other is maintained.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessary to scale relative to each other. Like reference numerals designate corresponding similar parts.

FIG. 8 illustrates a cross-sectional view of a completed memory cell forming part of the memory cell array of the present invention.

FIGS. 12 illustrates part of a memory cell array according to a further embodiment of the present invention.

DETAILED DESCRIPTION

Figure 1A:
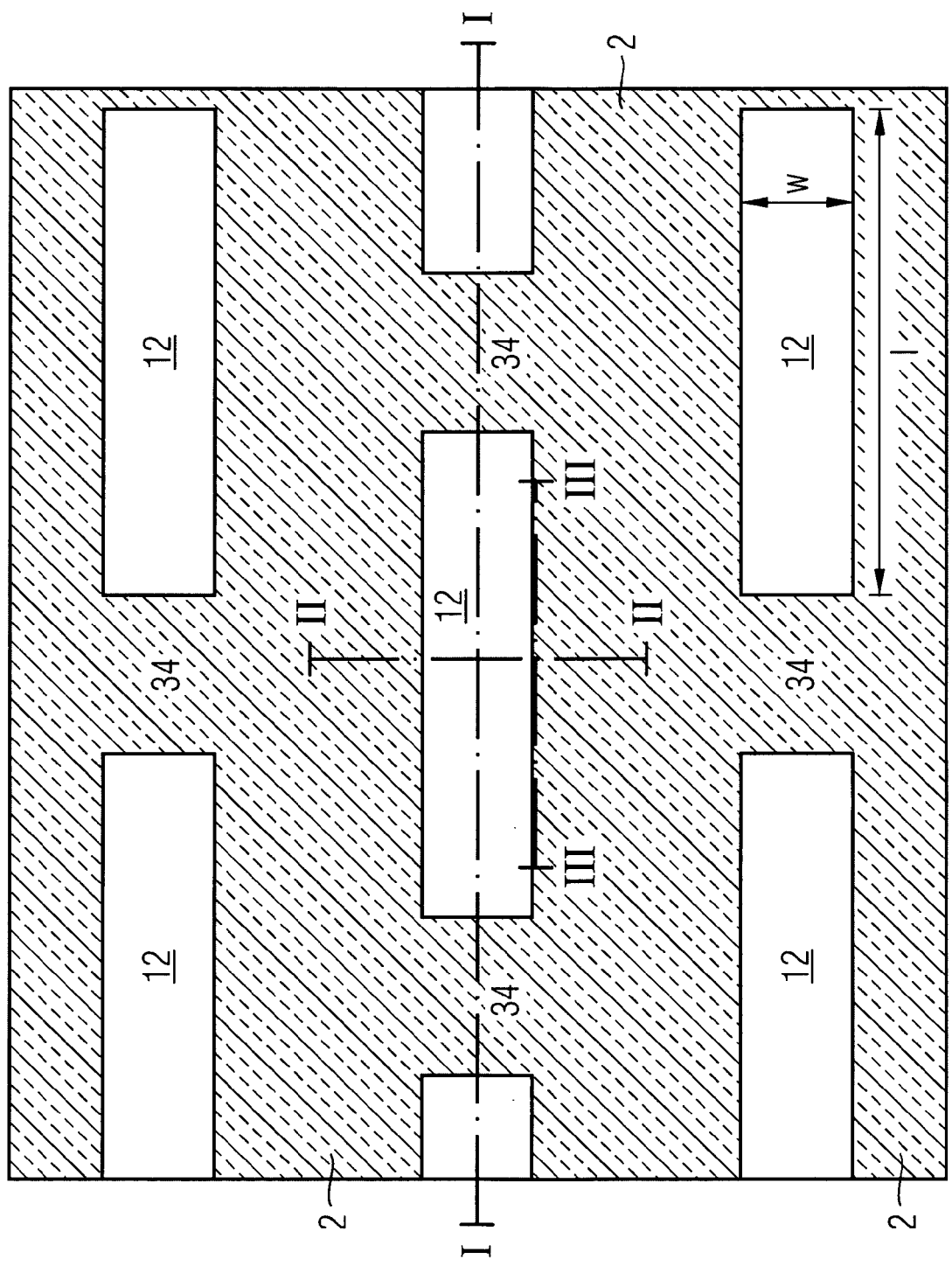
FIGS. 1 to 7 illustrate one embodiment of a method of manufacturing a memory cell array according to the present invention.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the present invention provides an improved method of forming a memory cell array. In addition, the present invention provides an improved memory cell array.

Embodiments of the invention provide a method of forming a memory cell array as well as a memory cell array. In one embodiment, the invention provides a method of forming a memory cell array, including providing a semiconductor substrate having a surface, providing a plurality of insulation grooves in said semiconductor substrate, providing a plurality of isolation trenches in said semiconductor substrate, said isolation trenches extending in a first direction, thereby defining a plurality of active areas, each of said active areas being delimited by two isolation trenches along a second direction perpendicular to said first direction, and each of said active areas being delimited by two insulation grooves along said first direction, each of said active areas having a width w and a length 1, said width w being measured along said second direction and said length 1 being measured along said first direction. An insulating material is provided in each of said isolation trenches and in an upper portion of said insulation grooves. At least one transistor is provided in each of said active areas, by providing a first and a second source/drain regions, forming a channel which is disposed between said first and second source/drain regions and providing a gate electrode for controlling an electrical current flow between said first and second source/drain regions, providing a plurality of storage capacitors comprising a first and a second capacitor electrodes as well as a capacitor dielectric disposed between said first and second capacitor electrodes, connecting said first source-/drain region of one of said transistors with a corresponding one of said second capacitor electrodes. Providing a gate electrode includes etching the insulating material in the isolation trenches at a portion adjacent to the channel so that a portion of said channel is uncovered, said portion having the shape of ridge comprising a top side and two lateral sides, providing a gate insulating layer on said top side and said two lateral sides, A conducting material is provided on said gate insulating layer so that as a result said gate electrode is disposed along said top side and said two lateral sides of the channel. Etching said insulating material in said isolation trenches is performed in which said insulating material is locally etched, wherein said insulating material in said upper portion of said insulation grooves is maintained.

The present invention provides a method in which the insulating material is recessed from the isolation trenches at predetermined portions so as to provide an uncovered portion of the active area or channel. At this uncovered portion a ridge of the channel is formed. The ridge comprises a top side and two lateral sides. The gate electrode is formed at this uncovered portion so as to be adjacent to three sides of the ridge. Since, according to the present invention, the insulating material is recessed only at the predetermined portions, the insulating material is maintained at the top portion of the insulation grooves. As a consequence, the word lines are disposed at a lower position only at those portions at which the gate electrode is formed. Accordingly, the passing word lines which usually are disposed above the insulation grooves are held at a higher level and therefore are better insulated from the adjacent active areas. As a result, cross-talking between passing word lines and active areas can advantageously be reduced.

In particular, the capacitor can be implemented as a trench capacitor. In this case, the step of providing a plurality of insulation grooves includes providing a plurality of capacitor trenches in said semiconductor substrate. In addition, providing a plurality of storage capacitors can advantageously be performed before providing a plurality of isolation trenches. Since during providing a gate electrode, the insulating material is recessed only at the predetermined portions at which the gate electrode is to be formed whereas the insulating material in the upper portion of the capacitor trenches is maintained, in particular, the trench top oxide which is formed above the first and second capacitor electrodes is not removed. Differently speaking, the insulating material is maintained at the top portion of the capacitor trenches as well as at those portions at which the buried strap is to be formed. Accordingly, a reliable insulation of the word lines with respect to the trench capacitors as well as to the buried strap portions is achieved.

According to embodiment, the portions in which said insulation material is to be locally etched are defined by patterning a resist material, in particular, a photoresist material which is patterned photolithographically using a mask.

In particular, the mask can have openings in the form of dots having a width along said second direction and a length along said first direction. In this case, it is especially preferred that the width of said dots is larger than said width of said active areas. This embodiment is advantageous since in this case the proper alignment of the dot mask with respect to the active areas is less critical.

Preferably, the length of the dots depends on the length of the active area and the maximum overlay error which can be obtained. If OL denotes the maximum overlay error, the following relation holds:

$$\text{length of the dots} < 1 - 2*OL.$$

In this case, a small misalignment will not cause a short between the wordlines and the active areas. For example, OL can be 0.2 to 0.3*F, wherein F denotes the minimum structural feature size which can be obtained by the technology used. The length of the active area depends on the array architecture. If a checkerboard layout of a memory cell array is implemented, the length of the active areas is 2.6 F. Accordingly, in this case, the length of the dots preferably is less than 2.0 F.

If an $8*F^2$ layout of memory cells having shared bit line contacts is implemented, the length of the active areas is 5*F. Accordingly, in this case, the length of the dots preferably is less than 4.4*F.

Alternatively, the mask can have openings in the form of segments of lines having a width along said second direction and a length along said first direction. In this case, it is especially preferred that the width of said segments of lines is larger than said width of said active areas. This embodiment is advantageous since in this case the proper alignment of the dot mask with respect to the active areas is less critical.

In addition, the length of said segments of lines can be as defined above. Preferably, the etching step is a tapered etching step. In this case, it is easier to pattern the gate electrode material using a dry etching step. In particular, when patterning the gate electrode material which is to be deposited later, shadow effects of the sidewalls of the recess formed in the insulating material are less critical.

According to a preferred embodiment, the method further comprises thinning the uncovered portion of said channel which is performed before providing a gate insulating layer. In this case the characteristics of the resulting transistor can further be improved.

Additionally, in one embodiment the capacitor trenches and the memory cells, respectively, are arranged in a checkerboard pattern.

In one embodiment, the invention further provides a memory cell array which is at least partially formed in a semiconductor substrate having a surface, said memory cell array including a plurality of isolation trenches, said isolation trenches extending in a first direction, each of said isolation trenches being filled with an insulating material, a plurality of active areas, each of said active areas being delimited by two isolation trenches along a second direction perpendicular to said first direction, and each of said active areas being delimited by two insulation grooves along said first direction, each of said active areas having a width w and a length 1, said width w being measured along said second direction, and said length 1 being measured along said first direction. An insulating material is disposed in an upper portion of said insulation grooves, at least one transistor being formed in each of said active areas. Each of said transistors include a first and a second source/drain regions, a channel which is disposed between said first and second source/drain regions and a gate electrode for controlling an electrical current flow between said first and second source/drain regions. A plurality of storage capacitors include a first and a second storage electrode and a dielectric layer disposed between said first and second storage electrodes, said first source/drain region of one of said transistors being connected with a corresponding one of said second storage electrodes, wherein each of said active areas has the form of a ridge in a portion of said channel, said ridge comprising a top side and two lateral sides, said gate electrode being disposed along said top side and said two lateral sides of the ridge, said insulation material in said isolation trenches being recessed in a portion adjacent to said ridge resulting in a recess adjacent to said ridge, said recess having a uniform depth d with respect to a surface of said active area.

FIG. 1A illustrates a plan view on a memory cell array after forming the storage capacitors (not illustrated in this Figure) and the active areas 12. In particular, the active areas are formed as segments of stripes, two segments of active areas 12 in one row being spaced apart from each other by the trench top oxide 34 which is formed above a corresponding trench capacitor below the surface of the insulating layer. Adjacent stripes of active areas 12 of different rows are spaced apart from each other by isolation trenches which are filled with an insulating material 2. The segments of the active areas 12 are arranged in a checkerboard manner, so that the segments of adjacent rows are arranged in a staggered manner. To be more specific, the segments of adjacent rows are offset by half of the cell pitch, in particular, 2 F. As is generally known, in the illustrated layout, a typical cell size is 8 $F^2$(=4 F*2 F).

A cross-section of the array illustrated in FIG. 1A between I and I is illustrated in FIG. 1B. As can be seen from FIG. 1B, trench capacitors 3 are provided so as to extend perpendicularly to the surface 10 of the semiconductor substrate 1, in particular, a silicon substrate. The trench capacitor 3 comprises an inner electrode 31, a capacitor dielectric 38, which is disposed between the inner electrode 31 and the outer electrode (not illustrated). In the upper portion of the trench capacitor 3, an isolation collar 32 is provided, as is conventional in the art. A polysilicon filling 36 is provided so as to accomplish an electrical contact between the inner capacitor electrode 31 and the buried strap window which is formed above the isolation collar. Above the polysilicon filling 36, a trench top oxide layer 34 is provided. For example, the total thickness of the top oxide layer 34 can be approximately 15 nm to 45 nm, the top oxide layer 34 projecting from the substrate surface 10 by approximately 0 nm to 30 nm.

The formation of the trench capacitor 3 and the description thereof is omitted, for the sake of convenience. In particular, the trench capacitor comprises a buried strap, so as to accomplish an electrical contact between the inner capacitor electrode 31 and the first source/drain portion of the transistor to be formed. The electrical contact between the inner capacitor electrode 31 and the first source/drain portion of the transistor to be formed can as well be accomplished by a surface strap, wherein an oxide is deposited thereon.

Figure 1C:
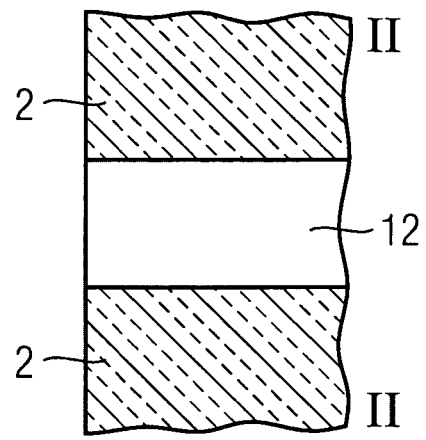

FIG. 1C illustrates a cross-sectional view between II and II in FIG. 1A. In particular, the cross-sectional view of FIG. 1C is taken so as to intersect the active area at the smaller cross-section thereof. As can be seen from FIG. 1C, the active areas 12 are delimited on either sides thereof by isolation trenches 2. For defining an active area, the isolation trenches 2 are photo-lithographically defined and etched, as is generally known. Thereafter, the isolation trenches 2 are filled with an insulating material, such as silicon dioxide.

Figure 1D:
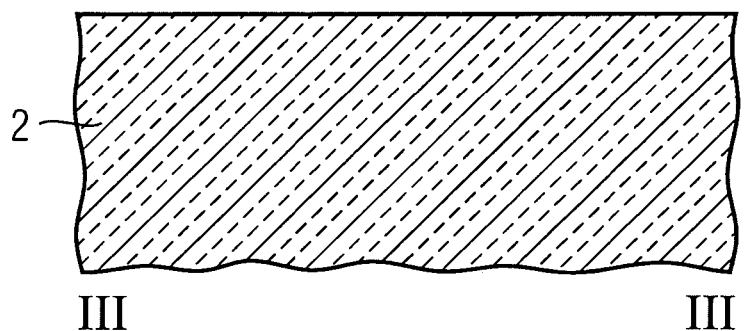

FIG. 1D illustrates a cross-sectional view between III and III, as can be seen from FIG. 1A. In particular, the cross-sectional view of FIG. 1D illustrates a cross-sectional view along an isolation trench, adjacent to an active area 12.

In particular, the active areas 12 typically have a width of 0.8 F, whereas an isolation trench 2 has a width w of 1.2*F. In particular, a sum of the width of the active area and the isolation trench amounts to 2 F. In addition, the distance between neighboring trench capacitors or, differently speaking, the length 1 of the active areas 12, amounts to approximately 2.6 F, whereas the total cell pitch amounts to 4 F.

Figure 2C:
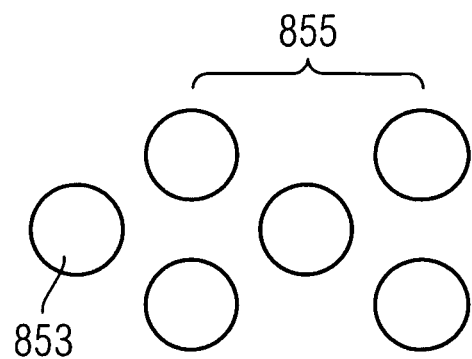
Figure 2A:
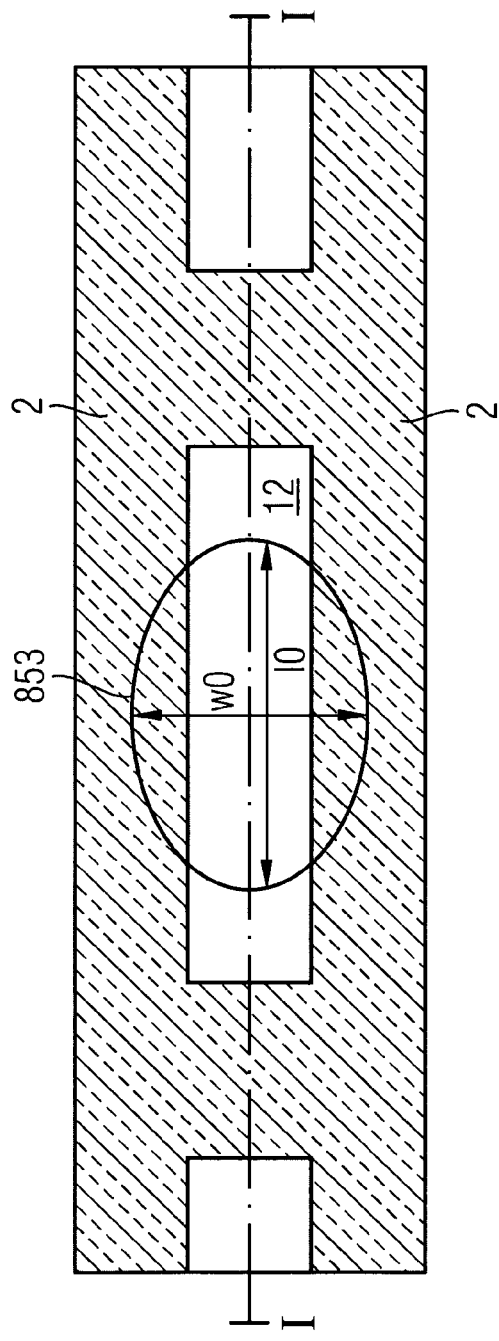

After the definition of the active areas, the whole array is covered with a sacrificial oxide layer which can in particular be thermally grown. In the next step, a photo-resist layer is applied on the surface and it is photo-lithographically patterned so as to form openings in which in a later step the oxide layer is to be etched. In particular, FIG. 2A illustrates a plan view on the resulting structure with a GC mask opening 853 which preferably has an elliptic, oval or round shape. Nevertheless, a square or rectangular shape of the mask openings 853 is preferred.

Figure 2B:
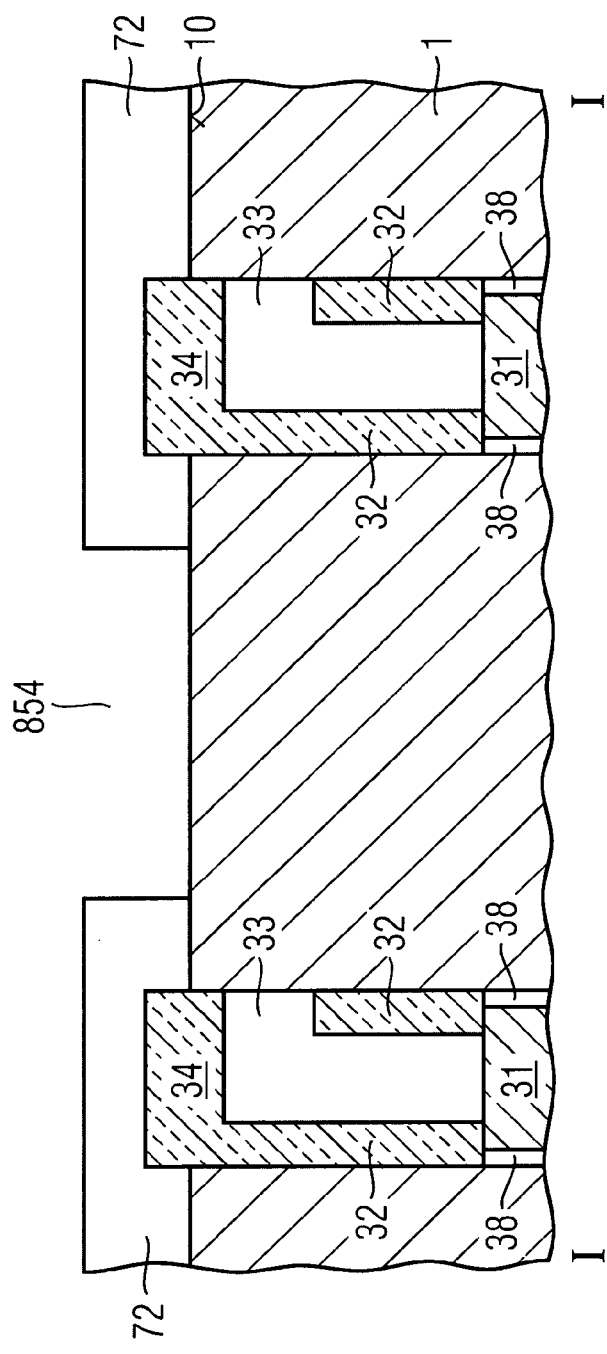

FIG. 2B illustrates a cross-sectional view of the structure. As can be seen from FIG. 2B, a photo-resist layer 72 is applied on the surface of the semiconductor substrate 1, and an opening 854 is formed in the photo-resist layer. In particular, the defined GC region 854 is photo-lithographically defined by generally known methods, using a mask 855 which is for example illustrated in FIG. 2C.

In particular, the mask 855 can have openings having a circular or an elliptic shape. For example, the openings can have a width w0 and a length 10, the length being measured along the active area lines, and the width being measured perpendicular with respect to the active area lines. Alternatively, the mask 855 can have openings having the shape of segments of lines. Likewise, these openings can have a width w0 and a length 10, the length being measured along the active area lines, and the width being measured perpendicular with respect to the active area lines.

According to the present invention, it is especially preferred that the width of the openings w0 is larger than the width of the active areas 12. In addition, it is preferred that the length of the openings 10 is smaller than the length of the active areas.

When overlaying the mask 855 with respect to the capacitor array, care has to be taken that the openings are formed at a position above the active areas so that as a consequence a portion of the isolation trench adjacent to the active area is unmasked. In addition, care has to be taken, that the openings are not formed at a position above the capacitor trenches so that the trench top oxide 34 will not be etched. Accordingly, the correct values w0 and 10 have to be determined with respect to a typical overlay error which is achieved by the photolithographic method used. These values further depend on the length and the width of the active areas, as well as on the width of the isolation trenches.

As has been discussed above, if OL denotes the maximum overlay error, the following relation holds:

$10 < 1 - 2*OL.$

In this case, a small misalignment will not cause a short between the wordlines and the trench capacitors. For example, OL can be 0.2 to 0.3*F, wherein F denotes the minimum structural feature size which can be obtained by the technology used. The length of the active area depends on the array architecture. If a checkerboard layout of a memory cell array is implemented, the length of the active areas is 2.6*F. Accordingly, in this case, the length of the dots preferably is less than 2.0*F.

If a $8*F^2$ layout of memory cells having shared bit line contacts is implemented, the length of the active areas is 5*F. Accordingly, in this case, the length of the dots preferably is less than 4.4*F. In addition, the following relation holds:

$w0 < 2*\text{width of the isolation trench} + w - 2*OL.$

Thereby, the active areas of adjacent rows are not opened due to a typical misalignment of the mask.

Next, the silicon dioxide layer which is present in the isolation trenches 2 is etched, for example by a dry etching method as generally known. In particular, this etching is performed as a selective etching, in which the insulating material of the isolation trench 2 is etched selectively with respect to the silicon material. Optionally, this etching can be performed as a tapered etching, so that the opening 74, which is for example illustrated in FIG. 3D has a larger diameter at a position near the surface 10 of the semiconductor substrate than at a bottom portion (74a) thereof.

As a further alternative, the etching can be formed as a wet etching using HF.

Figure 3A:
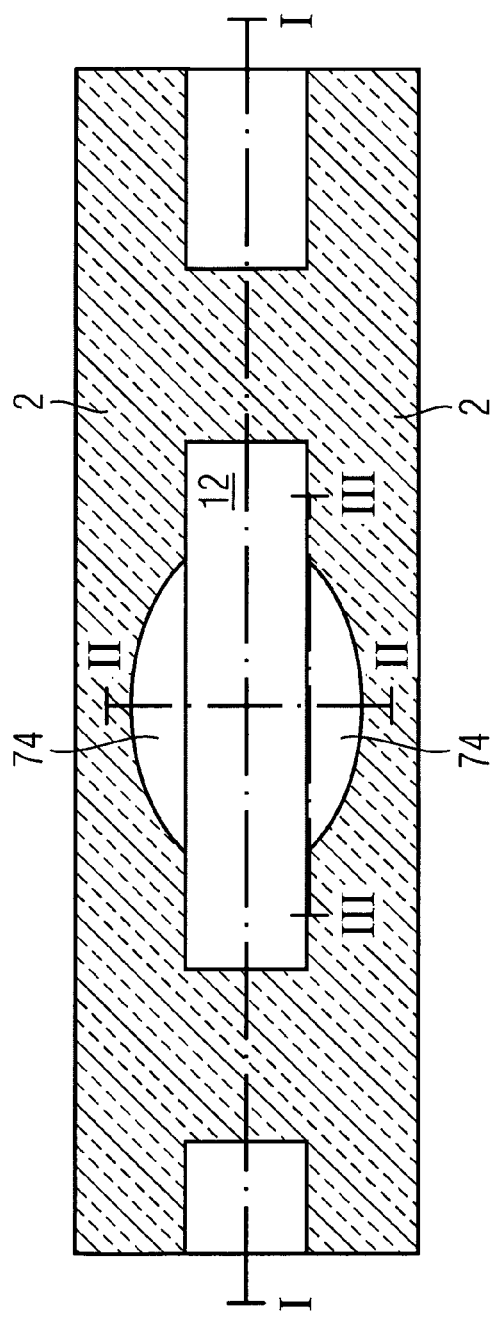

FIG. 3A illustrates a plan view on the resulting structure. In particular, recesses or pocket structures 74 are formed around the active areas 12.

Figure 3B:
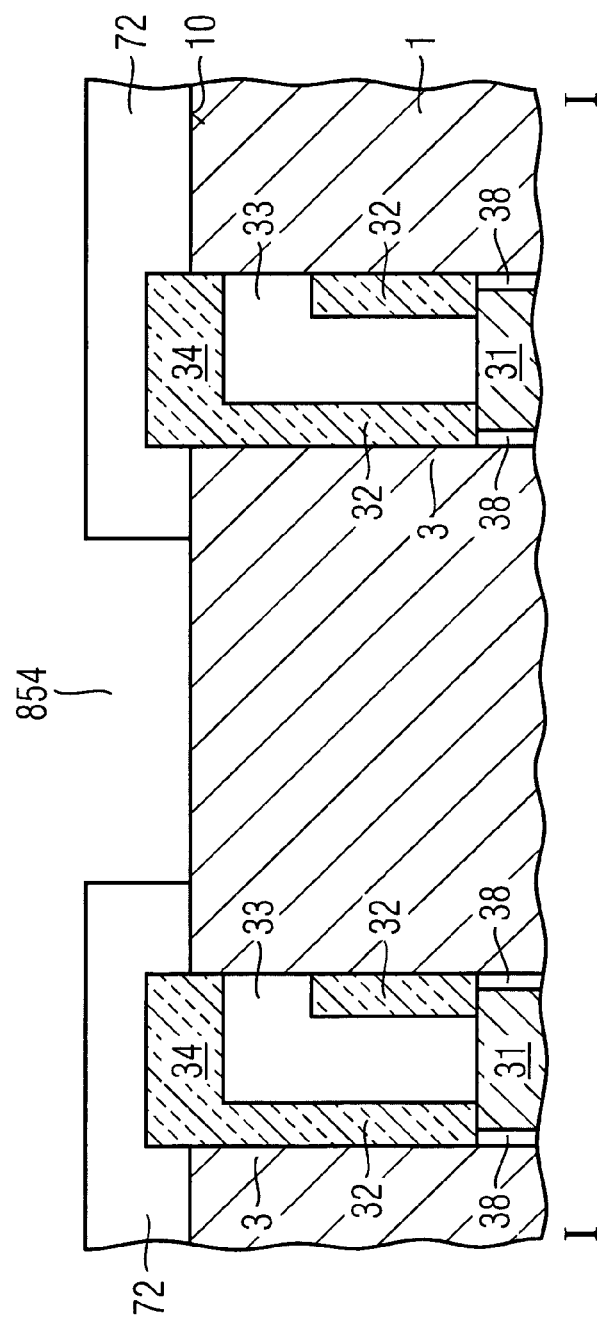

FIG. 3B illustrates a cross-sectional view between I and I along an active area 12, as can be taken from FIG. 3A. Since the etching is selective with respect to silicon, no silicon material is etched, and the structure illustrated in FIG. 3B is identical with the structure illustrated in FIG. 2B.

Figure 3C:
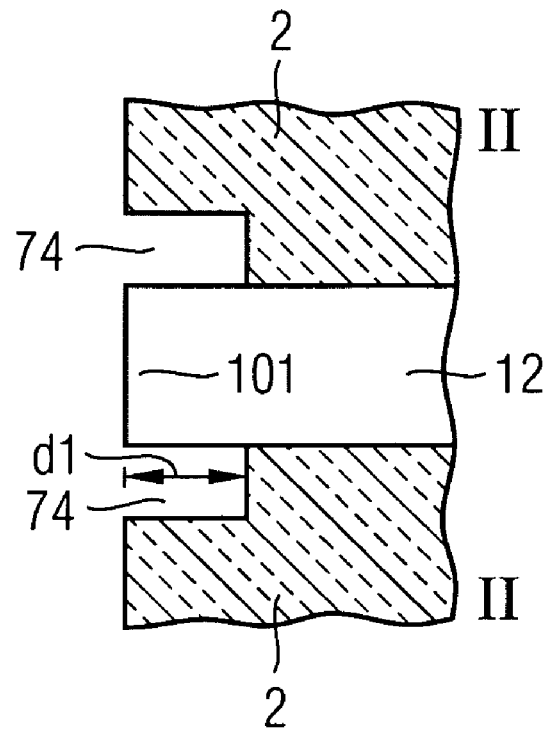

In addition, FIG. 3C illustrates a cross-sectional view between II and II, as can be taken from FIG. 3A. As can be seen from FIG. 3C, pocket structures 74 are formed in the isolation trenches at a portion adjacent to the active area 12.

Figure 3D:
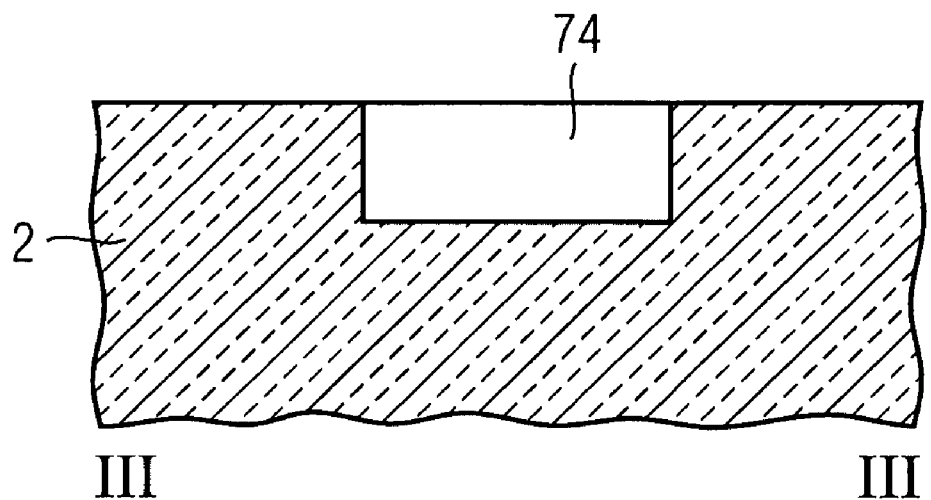

In addition, FIG. 3D illustrates a cross-sectional view between III and III, as can be taken from FIG. 3A. As can be seen from FIG. 3D, a pocket structure 74 is formed in the insulation material at a central portion of the illustrated cross-sectional view.

As can be seen from FIGS. 3C and 3D, the pocket structures 74 have a uniform depth in a direction parallel to the direction of the active areas. In addition, the pocket structures 74 have a uniform depth d1 in a direction perpendicular to the direction of the active areas. In particular, the depth d1 is measured with respect to the surface 101 of the active area.

Figure 4:
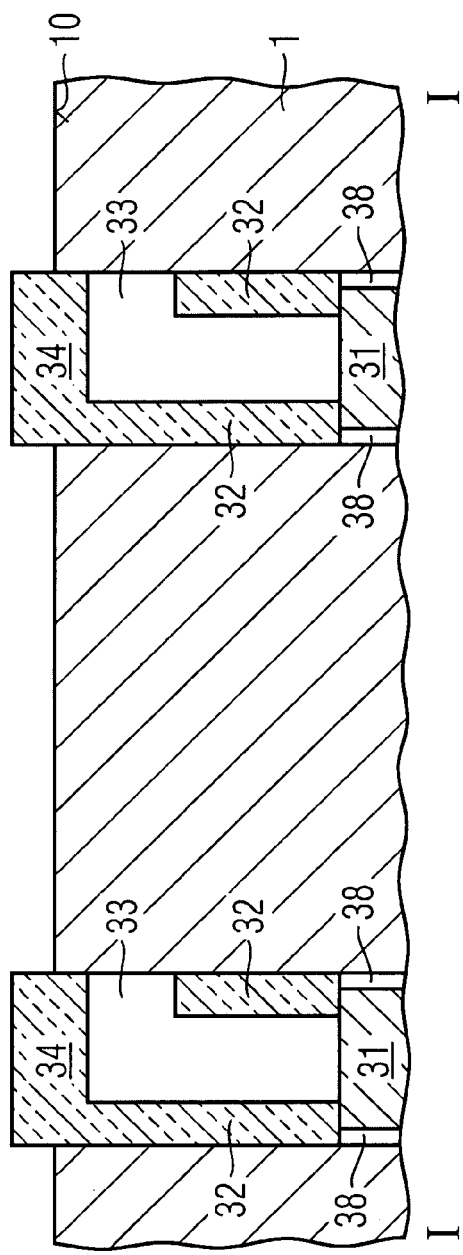

Next, the photo-resist material is stripped by generally known methods. The resulting cross-sectional view is illustrated in FIG. 4.

Figure 5:
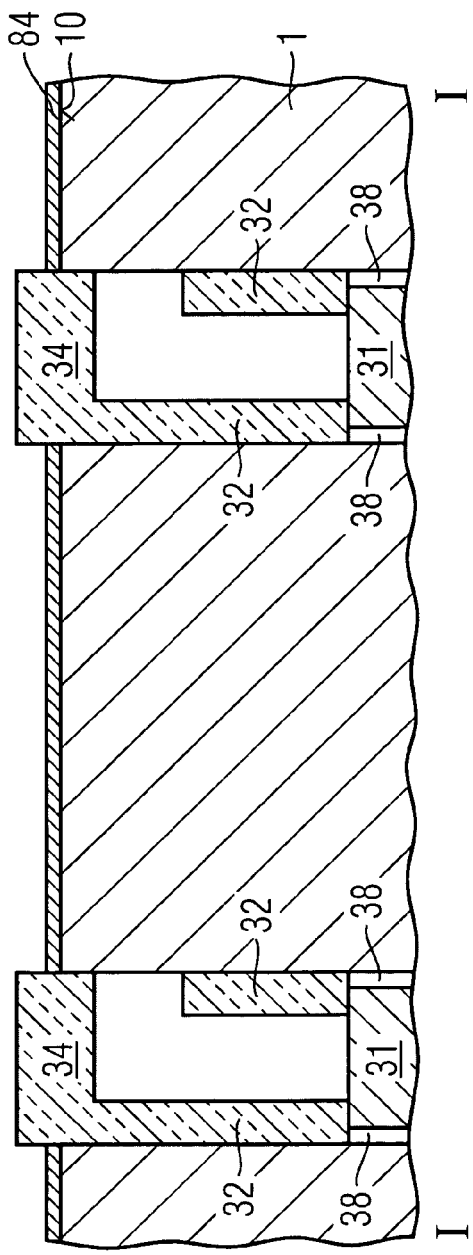

Thereafter, a gate oxide layer 84 is formed by generally known methods. The resulting structure is illustrated in FIG. 5.

Next, the material constituting the gate electrode is deposited as one or more layers covering the whole surface of the array. Thereafter, the wordlines are formed by patterning the layer(s) of the material constituting the gate electrode. In particular the material stack for the gate electrode is patterned so as to form stripes forming the active word lines 8a as well as the passing word lines 8b.

Figure 6A:
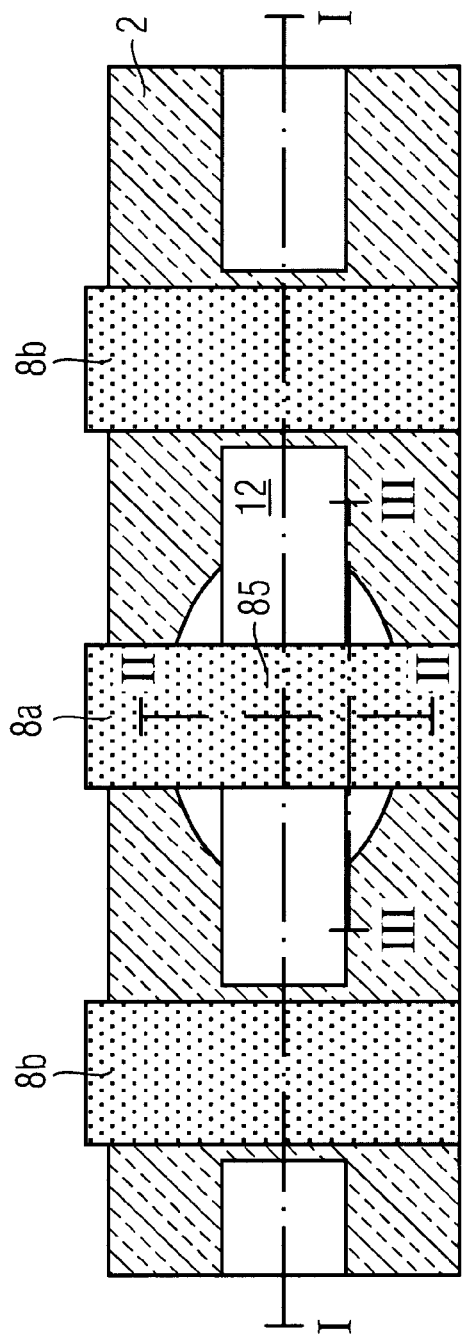

FIG. 6A illustrates a plan view on the resulting structure, wherein the word lines are arranged perpendicularly to the active areas. In particular, the active word line 8a is directly formed above the portion at which the insulation material has been recessed in the previously described process.

Figure 6B:
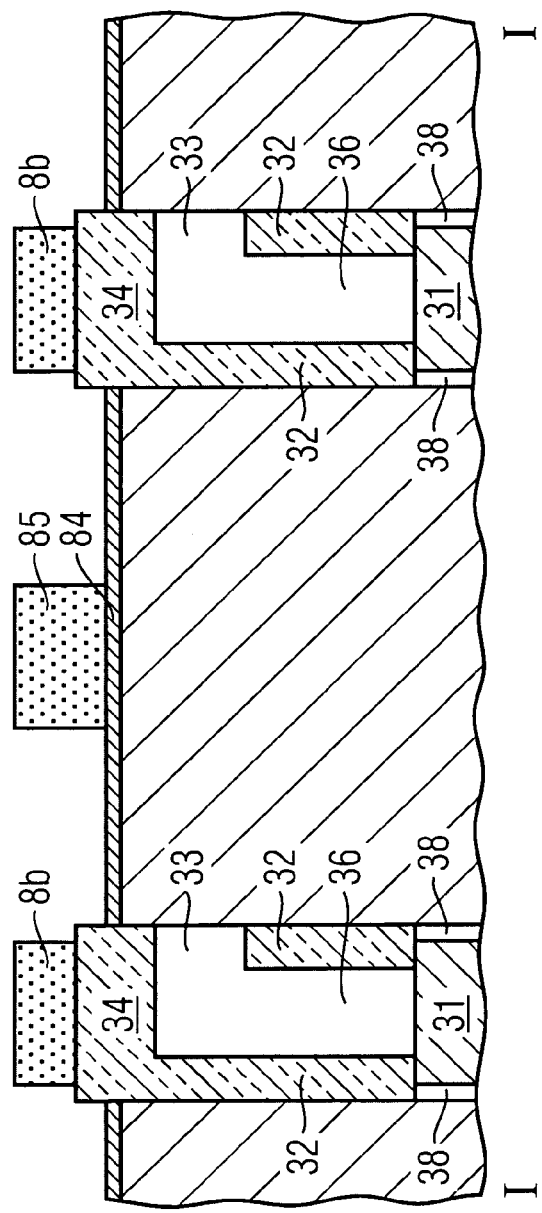

FIG. 6B illustrates a cross-sectional view of the resulting structure between I and I as can be seen from FIG. 6A.

In FIG. 6B, the active word line 85 is formed above the gate oxide layer 84 which is formed on the semiconductor surface. In particular, the passing word line 8b is electrically insulated from the polysilicon filling of the trench capacitor by the trench top oxide 34. Since the trench top oxide has a thickness of up to 30 nm, a sufficient insulation can be obtained between the passing word line 8b and the polysilicon filling 36 of the trench capacitor.

Figure 6C:
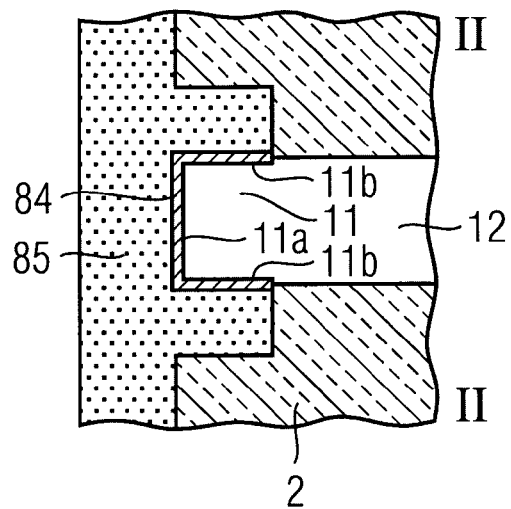

FIG. 6C illustrates a cross-sectional view of the structure between II and II as can be seen from FIG. 6A. In particular, now the gate electrode 85 is arranged on three sides of the ridge forming the active area 12. The gate electrode is insulated from the active area by a gate oxide 84. In particular, the active area has a top side 11a and two lateral sides 11b which are adjacent to the gate electrode 85. In particular, the gate electrode 85 laterally extends to a depth of approximately 10 to 100 nm, in particular, 20 nm.

Figure 6D:
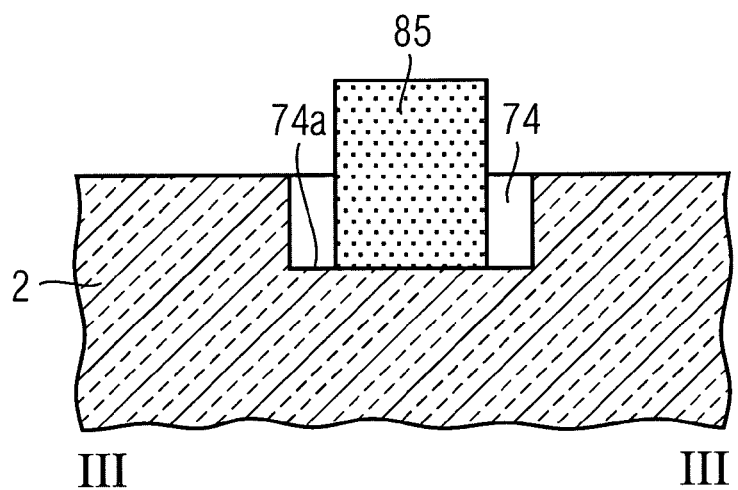

FIG. 6D illustrates a cross-sectional view between III and III as can be taken from FIG. 6A. As can be seen from FIG.

6D, it is necessary to etch the gate material stack to a depth so that the gate material is completely removed from the portions between the gate electrodes so as to avoid shorts between the gate electrode and the active area 12. In particular, the gate material must be etched to the bottom 74*a* of the openings.

Figure 6E:
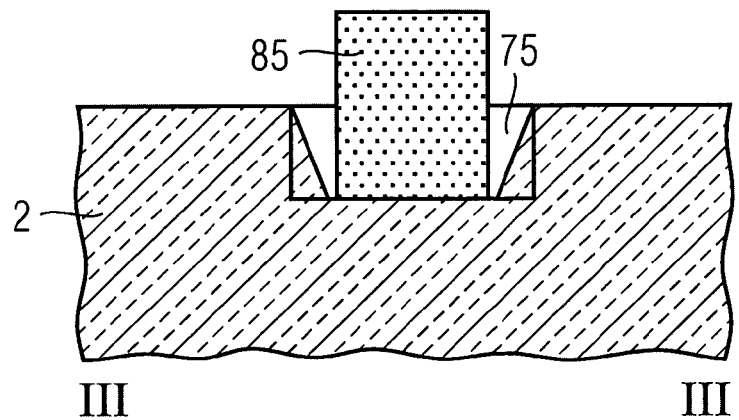

FIG. 6E illustrates a cross-sectional view between III and III, when the pocket structures 75 are formed by a tapered etching step, in which the upper diameter of the pocket structures 75 is larger than the lower diameter thereof. In particular, a tapered etching step is preferred, since in this case it is easier to etch the gate material 85 since no shadow effects of the side walls of the pocket structures will occur.

FIG. 7 illustrates an alternative cross-sectional view and plan view, respectively, in which the active area is thinned after etching the pocket structure in the isolation trench. In this embodiment, after the steps which have been described with reference to FIGS. 3A to 3D, an isotropic or anisotropic wet etching step for thinning the active area is performed. Thereby, the width w of the active area is decreased. Thereafter, a gate oxide layer 84 is formed, as is generally known, and thereafter, the gate material stack is deposited and patterned so as to form the active and passing word lines.

Figure 7A:
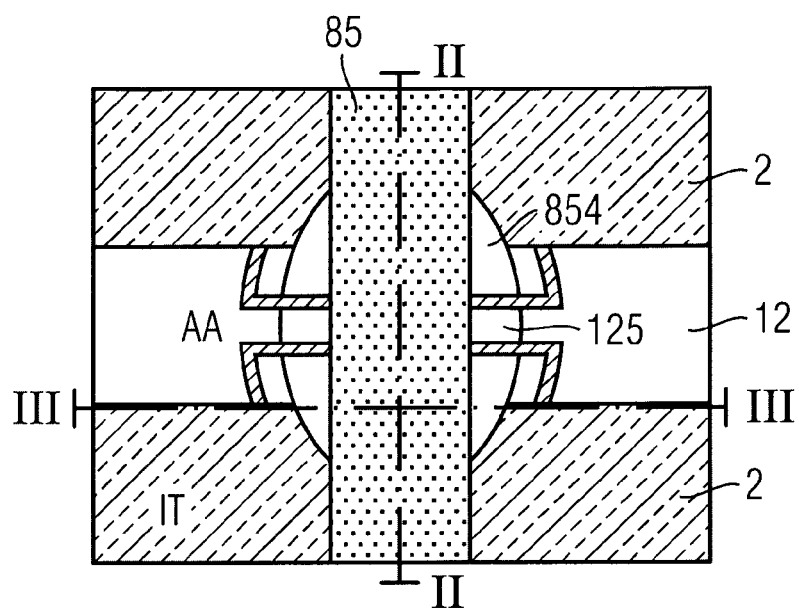

As can be seen from FIG. 7A, which illustrates a plan view on the resulting structure, at a portion adjacent to the gate electrode 85, the active area is thinned so as to form a narrowed thin region 125. Since in the step described with reference to FIG. 3C, the pocket structures 74 have been formed, only those lateral portions of the active area which are adjacent to the pocket structures 74 are uncovered. Accordingly, by the step of thinning the active region, only the active region at the defined GC region will be thinned. As a consequence, after the formation of the gate electrode, the thinned portion of the active area will be adjacent to the gate electrode.

Figure 7B:
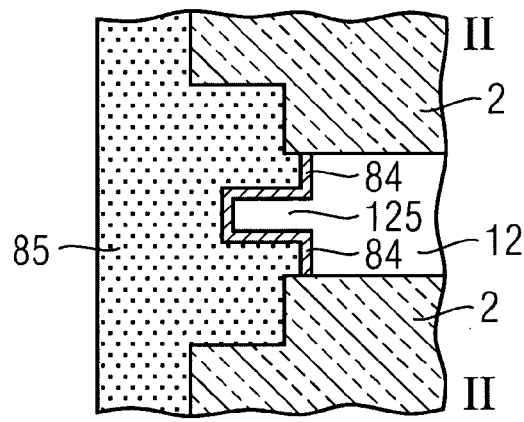

In addition, FIG. 7B illustrates a cross-sectional view of the resulting structure between II and II, as can be seen from FIG. 7A. As can be seen from FIG. 7B. the active area 12 in thinned at an upper portion thereof so as to form a narrowed thin region.

Figure 7C:
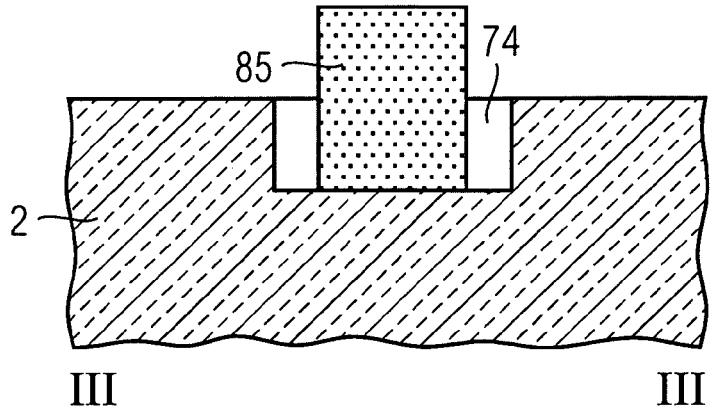

In addition, the cross-sectional view between III and III which is illustrated in FIG. 7C, is identical with the cross-sectional view illustrated in FIG. 6D.

Starting from the structure illustrated in any of FIGS. 6 and 7, the memory cell array is completed in a conventional manner. In particular, the usual process steps for completing the buried strap region 35, for conducting the implantation steps so as to provide the first and second source/drain regions are performed.

As a result, the transistor 16 as is illustrated in FIG. 8 is obtained. In FIG. 8, the transistor comprises a first and a second source/drain regions 121, 122. A channel 14 is formed between the first and the second source/drain regions 121, 122. A gate electrode 85 is provided, and it is insulated from the channel 14 by the gate oxide 84. The side walls of the gate electrode 85 as well as of the passing word lines 8*b* is covered with a spacer 86. The conductivity of the channel 14 is controlled by the gate electrode 85. The first source/drain region 121 of the transistor 16 is connected with the polysilicon filling 36 of the trench capacitor 3 via the buried strap 35. Above the trench capacitor 3, a passing word line 8*b* is provided. The passing word line 8*b* is electrically insulated from a polysilicon filling 36 of the trench capacitor 3 by a trench top oxide 34. When an appropriate voltage is applied to a gate electrode 85 via the corresponding active word line 8*a*, a charge stored in the inner electrode 31 of the trench capacitor 3 can be read out via the polysilicon filling 36, the buried strap 35, the first and the second source/drain regions 121, 122 and can be transmitted to the corresponding bit line (not illustrated in this Figure).

Figure 9:
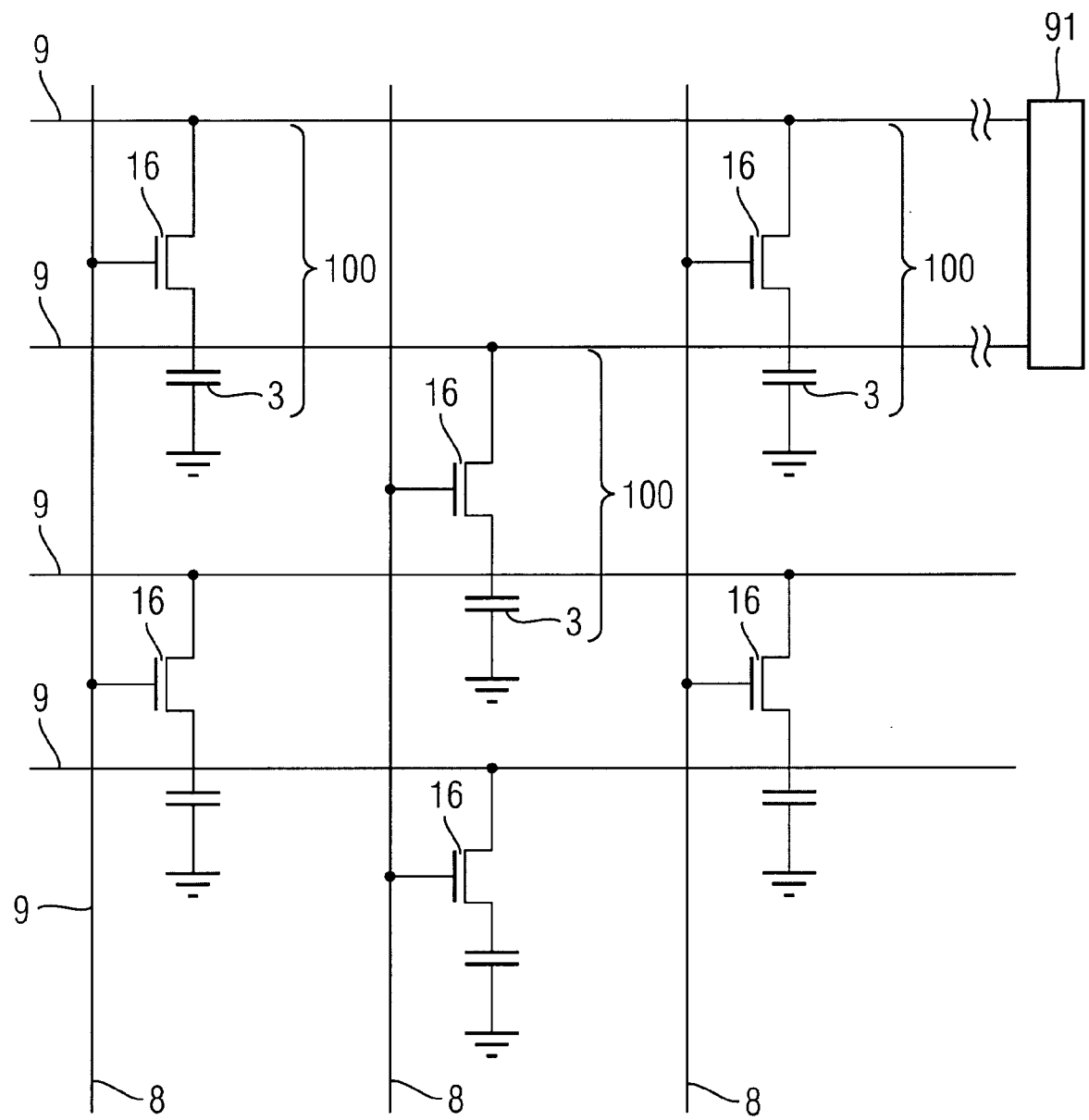
FIG. 9 illustrates a plan view on an exemplary memory cell array which can be formed by a method of the present invention.

FIG. 9 illustrates a schematic view of the memory cell array, which can be obtained by the process steps described, the memory cell array being implemented in an open-bitline configuration. As is illustrated in FIG. 9, a memory cell array comprises a plurality of memory cells 100 which are arranged in rows and columns, respectively. Each of the memory cells comprises a storage capacitor 3 as well as a transistor 16 which is connected with the storage electrode 31 of the storage capacitor 3. The memory cells 100 are arranged in a checkerboard manner, wherein the transistors 16 are assigned to first sites which are diagonally adjacent to each other. In addition, the storage capacitors 3 are assigned to second sites which are disposed between the first sites. A plurality of word lines 8 are arranged in parallel to each other.

The bit lines 9 are arranged perpendicularly with respect to the word lines 8, the bit lines 9 being parallel to each other. Each of the bit lines 9 is connected with a plurality of second source/drain regions of the memory cells 100. When addressing one of the word lines 8, a read-out operation of the corresponding storage capacitors will be caused from all the transistors connected with this specific word line. The information read is transmitted from the second source/drain region via the corresponding bit line 9 to the sense amplifier 91. The sense amplifier 91 likewise receives a corresponding reference signal from the reference bit line 9 which is connected with a non-addressed memory cell 100. The sense amplifier compares the two signals which are transmitted by the two bit lines 9, thereby eliminating undesired influences such as noise.

The embodiment illustrated with reference to FIGS. 1 to 8 specifically refers to a memory cell array in which the storage capacitors are implemented as trench capacitors. Nevertheless, as is clearly to be understood, the present invention is not restricted to this embodiment. The storage capacitors can as well be implemented as stacked capacitors.

Figure 10:
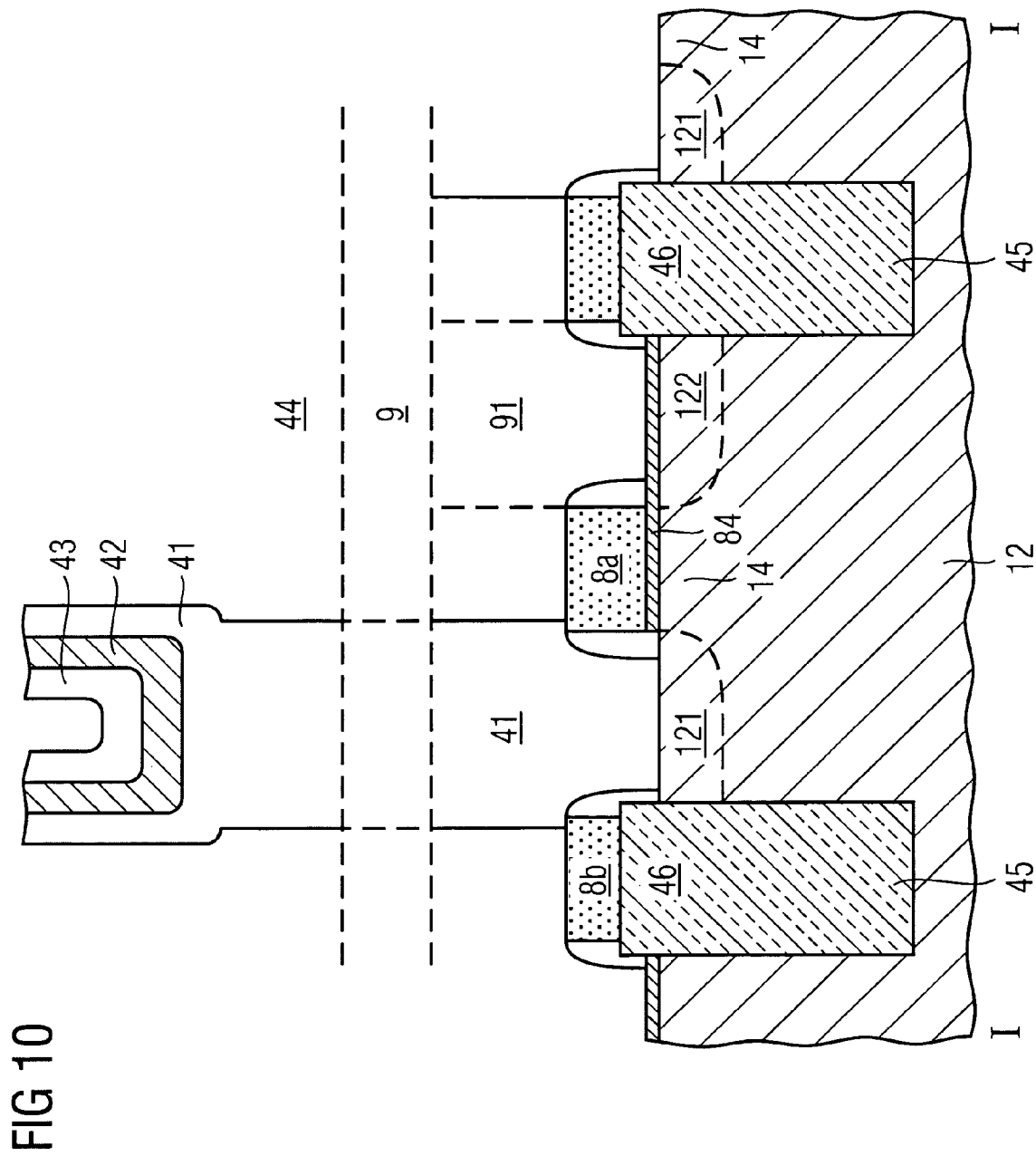
FIG. 10 illustrates a cross-sectional view of a completed memory cell forming part of a memory cell array according to a second embodiment of the present invention.

This embodiment is illustrated in FIG. 10. In FIG. 10, active areas are delimited from each other by insulation grooves 45 which are formed to a appropriate depth in the semiconductor substrate surface. The insulation grooves 45 are filled with an insulating material 46. The stacked capacitors 4 are formed above the semiconductor substrate surface 10. Each of the stacked capacitors comprises a second capacitor electrode 41 which is electrically connected with the first source/drain region 121 of a corresponding transistor. The stacked capacitor further comprises a first capacitor electrode 43 and a capacitor dielectric 42 which is disposed between the second and the first capacitor electrodes 41, 43. A bit line contact 91 connects the second source/drain region 91 with a corresponding bit line 9. The bit line contact 91 and the bit line 9 are disposed behind the illustrated drawing plane and, accordingly, are illustrated in broken lines. A BPSG layer 44 is disposed the stacked capacitor and electrically insulates the first capacitor electrode 43 from the components above.

Figure 11:
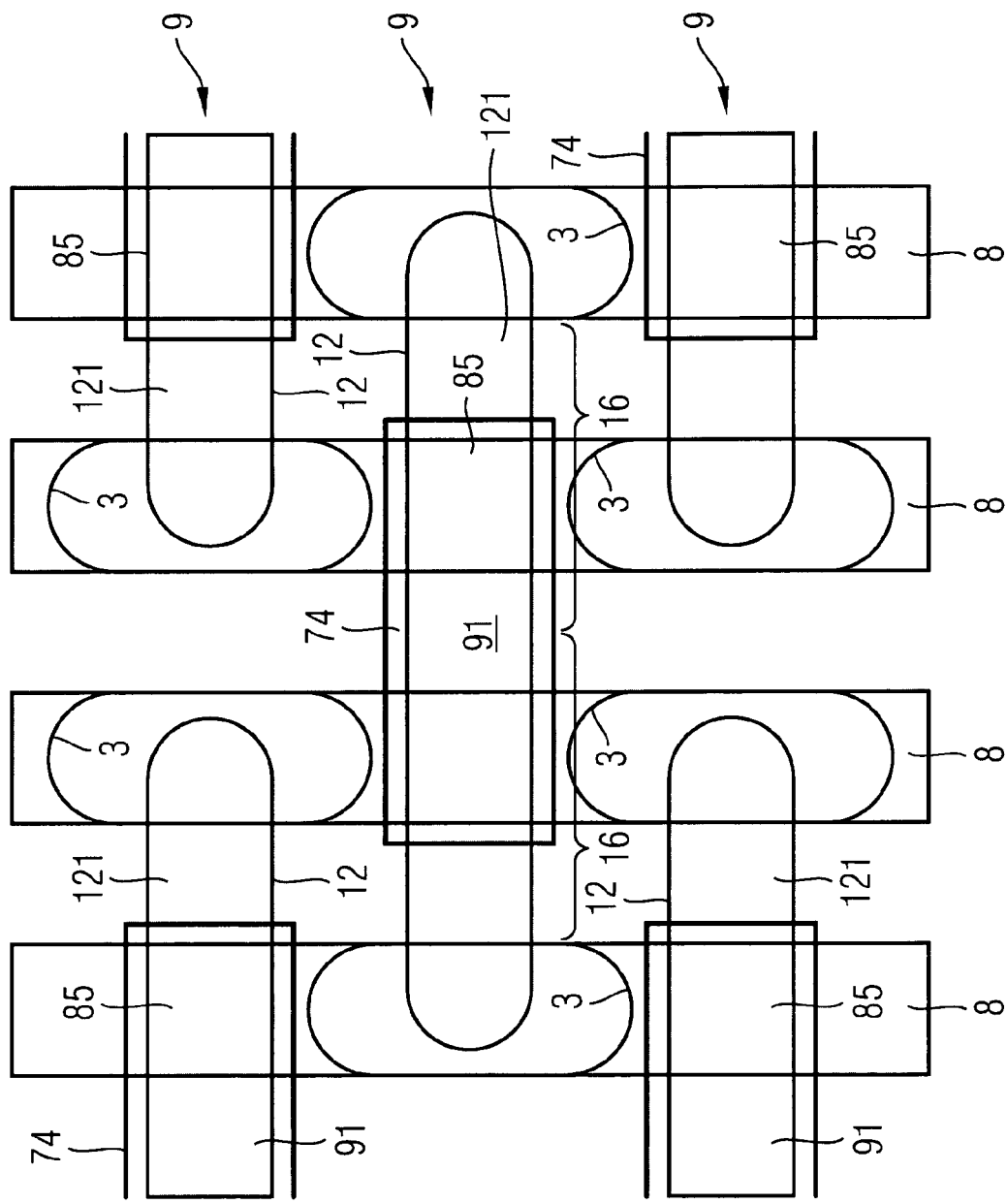
FIG. 11 illustrates a plan view on an exemplary memory cell array which can be formed by a second embodiment of the method of the present invention.

According to a further embodiment of the present invention, the memory cells can be arranged in a so-called $8*F^2$ layout of memory cells having shared bit line contacts as is for example illustrated in FIGS. 11 and 12.

FIG. 11 illustrates a layout of a corresponding memory cell array comprising memory cells in which the capacitor is implemented as a trench capacitor. In the illustrated layout, word lines 8 are disposed perpendicularly with respect to bit lines. Trench capacitors 3 are provided in pairs. As can be seen from the 2nd cell row in FIG. 11, one active area is disposed between two neighboring trench capacitors 3, two transistors 16 being formed in the active area. The two transistors 16, which are connected with different trench capacitors 3, respectively, share one common bit line contact 91. In FIG. 11 the pocket structure 74 is formed so as to have a length which is larger than 3*F. As a consequence, the insulating material at the channels of two adjacent transistors is removed. In this layout, at a certain cross-sectional view, the word lines are arranged in pairs so that two passing word lines are adjacent to two active word lines and vice versa.

In addition, this layout can as well be implemented with a memory cell array comprising memory cells in which the capacitor is formed as a stacked capacitor. This is illustrated in FIG. 12.

In particular, FIG. 12A illustrates a plan view on the memory cell array whereas FIG. 12B illustrates a cross-sectional view between III and III as can be taken from FIG. 12A.

In FIG. 12A, stacked capacitors 4 are illustrated, two stacked capacitors 4 being connected by one active area 12. Two transistors 16 are formed in one active area 12, the two transistors sharing a common bit line contact 91. Since the storage capacitor is implemented as a stacked capacitor, a redistribution contact 92 is provided so as to provided a contact of the bit line contact 91 to the bit line 92 which is dislocated with respect to the active areas 12. The pocket structures have a length larger than 3*F.

As can be seen from FIG. 12B, the pocket structures have a length so as to remove the insulating material which is adjacent to two neighboring gate electrodes. In the illustrated layout, two active word lines 8a are adjacent to two passing word lines 8b and vice versa.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a memory cell array, comprising:
   providing a semiconductor substrate having a surface;
   providing a plurality of insulation grooves in said semiconductor substrate,
   providing a plurality of isolation trenches in said semiconductor substrate, said isolation trenches extending in a first direction, thereby defining a plurality of active areas, each of said active areas being delimited by two isolation trenches along a second direction perpendicular to said first direction, and each of said active areas being delimited by two insulation grooves along said first direction, each of said active areas having a width w and a length l, said width w being measured along said second direction, and said length l being measured along said first direction;
   providing an insulating material in each of said isolation trenches and in an upper portion of said insulation grooves;
   providing at least one transistor in each of said active areas, by providing a first and a second source/drain regions, forming a channel which is disposed between said first and second source/drain regions and providing a gate electrode for controlling an electrical current flow between said first and second source/drain regions;
   providing a plurality of storage capacitors comprising a first and a second capacitor electrodes as well as a capacitor dielectric disposed between said first and second capacitor electrodes;
   connecting said first source/drain region of one of said transistors with a corresponding one of said second capacitor electrodes;
   wherein providing a gate electrode comprises etching the insulating material in the isolation trenches at a portion adjacent to the channel so that a portion of said channel is uncovered, said portion having the shape of ridge comprising a top side and two lateral sides wherein providing a gate electrode does not comprise recessing an upper surface portion of the substrate material;
   providing a gate insulating layer on said top side and said two lateral sides; and
   providing a conducting material on said gate insulating layer so that as a result said gate electrode is disposed along said top side and said two lateral sides of the channel, wherein said step of etching said insulating material in said isolation trenches is performed as a step in which said insulating material is locally etched, wherein said insulating material in said upper portion of said insulation grooves is maintained.

2. The method of claim 1, comprising defining the portions in which said insulation material is to be locally etched are defined by patterning a resist material.

3. The method of claim 2, comprising wherein said resist material is a photoresist material which is patterned photolithographically using a mask.

4. The method of claim 3, comprising defining the mask has openings in the form of dots having a width along said second direction and a length along said first direction.

5. The method of claim 4, comprising defining the width of said dots to be larger than said width of said active areas.

6. The method of claim 3, comprising defining the mask to have openings in the form of segments of lines, each of said segments of lines having a width along said second direction and a length along said first direction.

7. The method of claim 6, comprising defining the width of said segments of lines is larger than said width of said active areas.

8. The method of claim 1, wherein said etching is a tapered etching.

9. The method of claim 1, wherein providing a plurality of insulation grooves comprises forming a plurality of capacitor trenches in said substrate surface, each of said capacitor trenches extending in said substrate surface and having a sidewall, and wherein providing a storage capacitor is providing a trench capacitor in each of said trenches, wherein said first capacitor electrode is formed so as to be adjacent to said sidewall.

10. The method of claim 1, wherein providing a storage capacitor providing a stacked capacitor in which the first and second capacitor electrodes are formed above said surface of said semiconductor substrate.

11. The method of claim 1, further comprising thinning the uncovered portion of said channel which is performed before providing a gate insulating layer.

12. The method of claim 1, wherein said capacitor trenches are arranged in rows, said capacitor trenches of one row having a mutual distance corresponding to the length of the active areas, said capacitor trenches of neighboring rows being arranged in a staggered manner, so that the capacitor trenches of a certain row are offset by a half of the length of the active areas with respect to the capacitor trenches of the neighboring rows.

13. The method of claim 1, wherein two transistors being assigned to two adjacent memory cells are formed in one active area.

14. The method of claim 1, wherein the gate electrode laterally extends to a depth of 10 to 100 nm.

15. A method of forming a memory cell array comprising:
   forming a gate electrode after defining isolation trenches, comprising:
   etching a means for insulating in the isolation trenches at a portion adjacent to a channel such that a portion of the channel is uncovered, the uncovered portion having a shape of a ridge including a top side and two lateral sides;
   providing a gate insulating layer on the top side and the two lateral sides, wherein forming a gate electrode does not comprise recessing an upper surface portion of a substrate material; and
   providing a conducting material on the gate insulating layer configured such that the gate electrode is disposed along the top side and the two lateral sides of the channel, wherein etching of the insulating material in the isolation trenches is performed in which the means for insulating is locally etched, wherein the means for insulating material in the upper portion of insulation grooves which separate active areas from each other is maintained.

* * * * *